US011341914B2

(12) United States Patent
Yang et al.

(10) Patent No.: US 11,341,914 B2
(45) Date of Patent: May 24, 2022

(54) METHOD FOR DRIVING ORGANIC LIGHT EMITTING DISPLAY DEVICE, DRIVING CONTROLLER AND DISPLAY DEVICE

(71) Applicant: BOE TECHNOLOGY GROUP CO., LTD., Beijing (CN)

(72) Inventors: Fei Yang, Beijing (CN); Song Meng, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 352 days.

(21) Appl. No.: 16/481,796

(22) PCT Filed: Jan. 21, 2019

(86) PCT No.: PCT/CN2019/072548
§ 371 (c)(1),
(2) Date: Jul. 29, 2019

(87) PCT Pub. No.: WO2019/227953
PCT Pub. Date: Dec. 5, 2019

(65) Prior Publication Data
US 2021/0335253 A1 Oct. 28, 2021

(30) Foreign Application Priority Data
May 31, 2018 (CN) .......................... 201810549367.7

(51) Int. Cl.
G09G 3/3258 (2016.01)
G09G 3/00 (2006.01)
H01L 27/32 (2006.01)

(52) U.S. Cl.
CPC ........... G09G 3/3258 (2013.01); G09G 3/006 (2013.01); H01L 27/3262 (2013.01); G09G 2320/041 (2013.01); G09G 2320/045 (2013.01)

(58) Field of Classification Search
CPC .. G09G 3/3225; G09G 3/3266; G09G 3/3275; G09G 2310/08; G09G 2330/026; G09G 2320/0233
See application file for complete search history.

(56) References Cited

U.S. PATENT DOCUMENTS 9,489,888 B2 11/2016 Kim et al.
9,886,908 B2 2/2018 Tani et al.
(Continued)

FOREIGN PATENT DOCUMENTS

CN 103903561 A 7/2014
CN 103903561 B 3/2016
(Continued)

OTHER PUBLICATIONS

International Search Report for International Application No. PCT/CN2019/072548, dated Mar. 20, 2019.
(Continued)

Primary Examiner — Shaheda A Abdin
(74) Attorney, Agent, or Firm — Thomas | Horstemeyer LLP

(57) ABSTRACT

The present disclosure relates to a method for driving an organic light emitting display device, a driving controller, and a display device. When startup detection is required to be performed on the display compensation parameter of the organic light emitting display device, the startup detection is performed on the display compensation parameter of the organic light emitting display device to obtain a new compensation parameter value, and startup compensation display is performed based on the new compensation parameter value. When shutdown detection is required to be performed on the display compensation parameter of the organic light emitting display device, the shutdown detection is performed on the organic light emitting display device to obtain (Continued)

an updated compensation parameter value, and the updated compensation parameter value is stored.

20 Claims, 7 Drawing Sheets

(56) References Cited

U.S. PATENT DOCUMENTS

| | | | | |
|---|---|---|---|---|
| 2005/0201615 A1* | 9/2005 | Hsu | ............. | H04N 9/69 |
| | | | | 358/1.9 |
| 2005/0212825 A1* | 9/2005 | Lee | ............. | H04N 5/20 |
| | | | | 345/690 |
| 2007/0109232 A1* | 5/2007 | Yamamoto | ........ | G09G 3/3233 |
| | | | | 345/77 |
| 2014/0084792 A1* | 3/2014 | Oh | ............. | H05B 47/10 |
| | | | | 315/120 |
| 2014/0176516 A1* | 6/2014 | Kim | ............. | G09G 3/3233 |
| | | | | 345/204 |
| 2017/0004765 A1* | 1/2017 | Tani | ............. | G09G 3/3233 |
| 2020/0193906 A1* | 6/2020 | Wang | ............. | G09G 3/3233 |

FOREIGN PATENT DOCUMENTS

| | | |
|---|---|---|
| CN | 106297691 A | 1/2017 |
| CN | 106328052 A | 1/2017 |
| CN | 107316611 A | 11/2017 |
| CN | 108399891 A | 8/2018 |
| CN | 105761673 B | 9/2018 |
| CN | 109697944 A | 4/2019 |

OTHER PUBLICATIONS

Written Opinion for International Application No. PCT/CN2019/072548, dated Mar. 20, 2019.
Office Action for Chinese Application No. 201810549367.7, dated Aug. 7, 2019.

* cited by examiner

METHOD FOR DRIVING ORGANIC LIGHT EMITTING DISPLAY DEVICE, DRIVING CONTROLLER AND DISPLAY DEVICE

CROSS-REFERENCE TO RELATED APPLICATIONS

The present application is a § 371 national phase application of, and is based upon, International Application No. PCT/CN2019/072548, filed on Jan. 21, 2019, which claims the benefit of and priority to Chinese Patent Application No. 201810549367.7, filed on May 31, 2018, where the entire contents of which are incorporated herein by reference.

TECHNICAL FIELD

The present disclosure relates to the field of display technologies and, more particularly, to a method for driving an organic light emitting display device, a driving controller, and a display device.

BACKGROUND

With the continuous advancement of technology, users pay more attention to the price and practicality of products and, meanwhile, they also have increased demand regarding the quality of the products. In the field of displays, especially in the field of organic light-emitting displays (OLEDs), improving the display quality of an image has always been the direction of technicians. In an OLED display device, a change in the characteristics of a driving thin-film transistor (TFT) can affect the display quality.

SUMMARY

The present disclosure provides a method for driving an organic light emitting display device, a drive controller, and a display device.

According to one aspect of the present disclosure, a method for driving an organic light emitting display device is provided, the organic light emitting display device including a plurality of pixel units, each pixel unit including a pixel driving circuit and a light emitting element coupled to the pixel driving circuit, and the pixel driving circuit including a driving transistor. The method includes:

during a startup operation stage of the organic light emitting display device, determining whether startup detection is required to be performed on a display compensation parameter of the organic light emitting display device;

when the startup detection is required to be performed on the display compensation parameter of the organic light emitting display device, performing startup operations of:

performing the startup detection on the display compensation parameter of the organic light emitting display device to obtain a new compensation parameter value; and performing startup compensation display based on the new compensation parameter value;

during a shutdown operation stage of the organic light emitting display device, determining whether shutdown detection is required to be performed for the organic light emitting display device; and when the shutdown detection is required to be performed on the display compensation parameter of the organic light emitting display device, performing shutdown operations of:

performing the shutdown detection on the organic light emitting display device to obtain an updated compensation parameter value; and storing the updated compensation parameter value.

According to some embodiments, the display compensation parameter includes at least one of an electrical compensation parameter and an optical compensation parameter.

According to some embodiments, the electrical compensation parameter includes a threshold voltage and/or mobility of the driving transistor of each pixel unit, and/or a threshold voltage of the light emitting element of each pixel unit.

According to some embodiments, the optical compensation parameter includes a luminance lookup table and a luminance fitting parameter for each pixel unit.

According to some embodiments, when the startup detection is performed on the display compensation parameter of the organic light emitting display device, the display compensation parameter further includes an environmental compensation parameter, and the environmental compensation parameter includes at least one of an ambient light parameter, a user viewing distance, and a current luminance of the organic light emitting display device.

According to some embodiments, determining whether startup detection is required to be performed on a display compensation parameter of the organic light emitting display device includes: determining whether to perform the startup detection according to at least one of a shutdown rest time duration, a temperature difference value between the time of startup and the last time of shutdown, and a stage-cumulative display time duration.

According to some embodiments, the shutdown operation further includes: acquiring and storing at least one of an ambient temperature, a panel temperature, and a circuit board temperature at the time of shutdown.

According to some embodiments, the startup operation further includes: acquiring at least one of an ambient temperature, a panel temperature of the organic light emitting display device, and a circuit board temperature of the organic light emitting display device at the time of startup; and acquiring a corresponding difference value between at least one of the ambient temperature, the panel temperature, and the circuit board temperature detected at the time of startup and at least one of the ambient temperature, the panel temperature, and the circuit board temperature at the last time of shutdown.

According to some embodiments, determining whether shutdown detection is required to be performed for the organic light emitting display device includes: determining whether to perform the shutdown detection according to at least one of a stage-cumulative display time duration and a single-time display time duration.

According to some embodiments, the shutdown operation further includes: causing the organic light emitting display device to rest in a black screen for a period of time before the shutdown detection is performed on the organic light emitting display device. For example, the organic light emitting display rests in the black screen for 30 seconds to 10 minutes according to startup operation time.

According to some embodiments, the method further includes: during a display operation stage, performing real-time compensation detection on the organic light-emitting display device, and performing compensation display on display data based on a display compensation parameter detected in real time.

According to some embodiments, the method further includes: when the startup detection is not required to be performed on the display compensation parameter of the organic light emitting display device, using the stored display compensation parameter to perform startup compensation display.

According to another aspect of the present disclosure, a driving controller for an organic light emitting display device is provided, the organic light emitting display device including a plurality of pixel units, each pixel unit including a pixel driving circuit and a light emitting element coupled to the pixel driving circuit, the pixel driving circuit including a driving transistor, and the organic light emitting display device further including a compensation detection circuit for detecting a display compensation parameter. The driving controller includes:

a first detection-determining circuit configured to, during a startup operation stage of the organic light emitting display device, determine whether startup detection is required to be performed on a display compensation parameter of the organic light emitting display device;

a second detection-determining circuit configured to, during a shutdown operation stage of the organic light emitting display device, determine whether shutdown detection is required to be performed for the organic light emitting display device;

a compensation detection control circuit configured to control the compensation detection circuit to perform startup detection or shutdown detection to obtain a new compensation parameter value according to the determination result of the first detection-determining circuit or the second detection-determining circuit;

a compensation driving circuit configured to perform startup display compensation according to an existing display compensation parameter or the new compensation parameter value during the startup operation stage; and a memory access circuit configured to access an external memory.

According to some embodiments, the driving controller further includes: an external detection data acquisition circuit configured to acquire external environment detection data.

According to some embodiments, the driving controller is integrated in a timing controller.

According to some embodiments, the first detection-determining circuit is configured to determine whether to perform the startup detection according to at least one of a shutdown rest time duration, a temperature difference value between the time of startup and the time of shutdown, and a stage-cumulative display time duration.

According to some embodiments, the second detection-determining circuit is configured to determine whether to perform the shutdown detection according to at least one of a stage-cumulative display time duration and a single-time display time duration.

According to some embodiments, the compensation driving circuit is further configured to, during a display operation stage, perform real-time compensation detection on the organic light-emitting display device, and perform compensation display on display data based on a display compensation parameter detected in real time.

According to yet another aspect of the present disclosure, a display device is provided. The display device includes a plurality of pixel units, each pixel unit including a pixel driving circuit and a light emitting element coupled to the pixel driving circuit, the pixel driving circuit including a driving transistor, the display device further including a compensation detection circuit, and the display device further includes: any one of the driving controller described above; and a memory for storing data related to display compensation.

According to some embodiments, the organic light emitting display device further includes: a temperature sensor configured to acquire at least one of an ambient temperature, a panel temperature of the organic light emitting display device, and a circuit board temperature of the organic light emitting display device.

BRIEF DESCRIPTION OF THE DRAWINGS

The accompanying drawings are included to provide a further understanding of the present disclosure. The accompanying drawings, which are incorporated in the present application and constitute a part of the present application, illustrate embodiments of the present disclosure and, together with the description, serve to explain the principles of the present disclosure. Understandably, the following drawings are only some of the embodiments of the present disclosure, and other drawings can be obtained by those skilled in the art from theses drawings without paying creative effort. In the drawing.

DETAILED DESCRIPTION

Figure 1A:
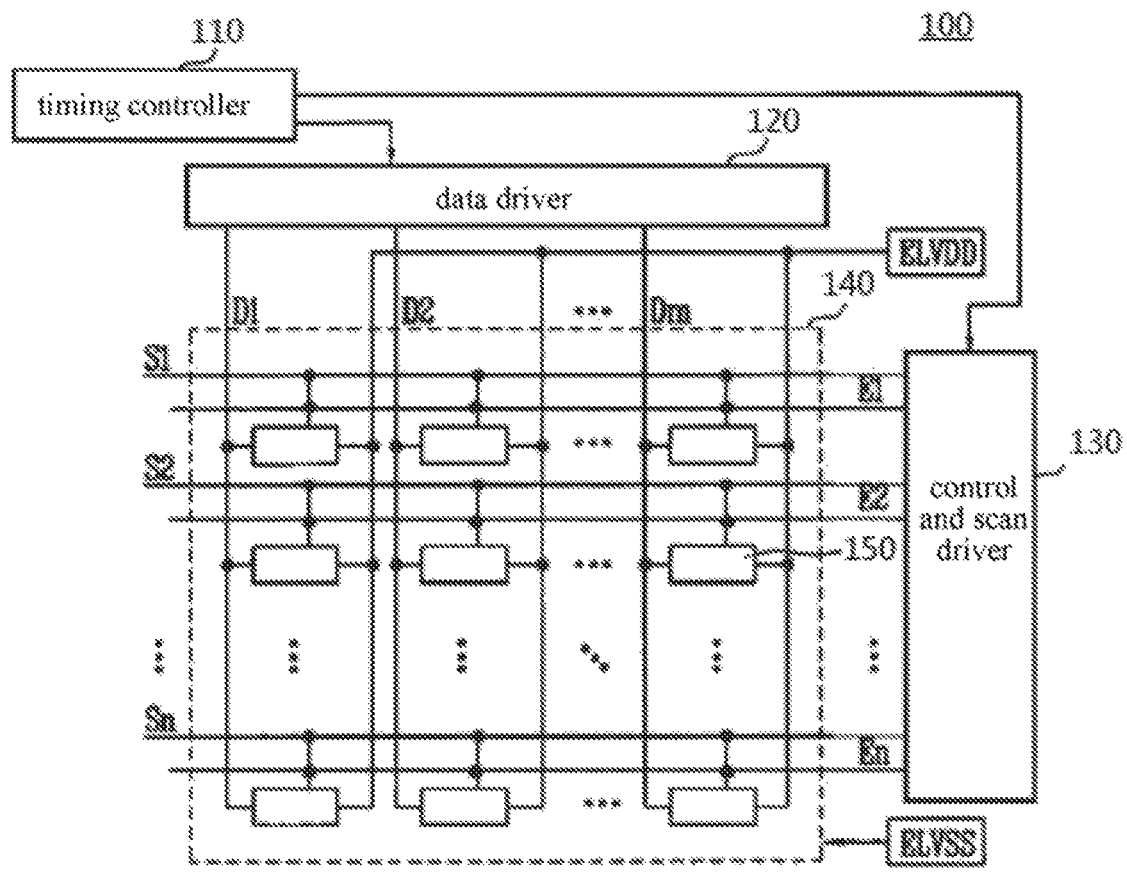
FIG. 1A illustrates an organic light emitting display device according to an exemplary embodiment of the present disclosure.

Example embodiments will now be described more fully with reference to the drawings. However, the exemplary embodiments can be embodied in a variety of forms and should not be construed as being limited to the embodiments set forth herein. Rather, these embodiments are provided to make the present disclosure more thorough and complete, and to fully convey the concept of the exemplary embodiments to those skilled in the art. The same reference numerals in the drawings denote the same or similar parts, and the repeated description thereof will be omitted.

Furthermore, the described features, structures, or characteristics can be combined in any suitable manner in one or more embodiments. In the following description, numerous specific details are set forth to provide a thorough understanding of the embodiments of the disclosure. However, it would be appreciated by those skilled in the art that the technical solutions of the present disclosure can be practiced without one or more of the specific details, or other methods, components, materials, devices, steps, etc. can be employed. In other instances, well-known structures, methods, devices, implementations, materials, or operations are not shown or described in detail to avoid obscuring aspects of the present disclosure.

The block diagrams shown in the figures do not necessarily have to correspond to physically separate entities. That is, these functional entities can be implemented in software, or implemented in one or more hardware modules or integrated circuits, or implemented in different networks, processor devices, and/or microcontroller devices.

The flowcharts shown in the drawings are merely illustrative and not necessarily include all of the steps. For example, some steps can be decomposed, and some steps can be combined or partially merged, so the actual execution order can vary depending on the actual situation.

In an OLED display device, characteristics of driving TFTs vary largely when they rest for a long time, operate for a long time, or when the temperature difference is large. For example, a threshold voltage parameter of a driving TFT after a long-term operation will drift forward (be increased) and a threshold voltage parameter of the driving TFT will drift negatively (be decreased) after the driving TFT rests for a long time. In the case of long-term operation and long-term rest, uneven luminance, afterimages, and the like can affect the image quality due to changes in the characteristics of the driving TFT when being started up. Further, as the temperature rises, the parameter of the mobility $\mu$ of the driving TFT becomes large and, when the temperature is lowered, the parameter of the mobility $\mu$ of the driving TFT becomes small. When the temperature difference between the shutdown and the startup is large, the change in characteristic of the driving TFT is large, which can cause unevenness in the luminance of the screen of the OLED display device, and degrade the picture quality.

The inventors have found that, although a scheme for performing compensation detection at the time of startup and shutdown can improve the display quality, there is a problem that the detection time affects the user experience. For example, the compensation detection operation at the time of startup can take 2 seconds or more, and the detection operation at the time of shutdown can be performed for 30 seconds or more. Sometimes, this will cause an unpleasant waiting time for the user.

In addition, the inventors have found that startup and shutdown detection is not necessary in all cases. For example, when the usage frequency is relatively high, and each operation time period is not excessively long, the display compensation parameter will not change notably.

Therefore, the inventors of the present application have proposed a solution of selectively performing compensation detection during the startup and shutdown processes, in order to improve the user experience and at the same time improve the display quality. The technical solutions of the embodiments of the present disclosure are described in detail below.

FIG. 1A illustrates an organic light emitting display device according to an exemplary embodiment of the present disclosure.

As shown in FIG. 1A, the organic light emitting display device 100 includes a timing controller 110, a data driver 120, a control and scan driver 130, and a pixel array 140. The pixel array 140 has a plurality of pixel units 150, and each of the pixel units 150 includes a driving circuit and a light emitting element (not shown) coupled to the driving circuit. Each driving circuit includes a driving transistor. The plurality of pixel units 150 are connected to scan lines S1 to Sn, data lines D1 to Dm, light emission control lines E1 to En, a first power source ELVDD, and a second power source ELVSS, respectively.

The control and scan driver 130 is configured to sequentially supply scan signals to the scan lines S1 to Sn and provide light emission control signals to the light emission control lines E1 to En. The data driver 120 is configured to provide data signals to the data lines D1 to Dm.

When the scan signals are sequentially supplied to the scan lines, a pixel unit row connected to the scan line is selected. Accordingly, the selected pixel unit receives the data signal (data voltage) from the data line. The data voltage controls the current to flow from the power source ELVDD to the OLED, thereby controlling the OLED to generate light having a corresponding luminance, and thus displaying an image. The light emission time period of the pixel unit is controlled by the light emission control signal.

The data driver 120 and the control and scan driver 130 are controlled by the timing controller 110. The timing controller 110 can provide a data driving control signal to the data driver 120, and provide a scan driving control signal and a light emission drive control signal to the control and scan driver 130.

The organic light emitting display device 100 further includes a compensation detection circuit (not shown) that detects a display compensation parameter. For example, the driver circuit can include a detection circuit configured to detect a threshold voltage and/or a mobility of the driving transistor, as is well known to those skilled in the art.

It is to be understood that the display device shown and described in FIG. 1A is merely exemplary and is not intended to limit the present disclosure.

Figure 1B:
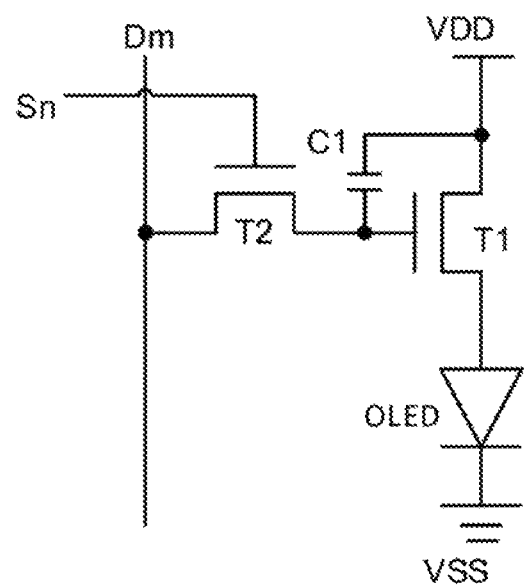
FIG. 1B illustrates an exemplary driving circuit of a pixel unit.

FIG. 1B illustrates an exemplary driving circuit of a pixel unit.

Referring to FIG. 1B, as is well known to those skilled in the art, a driving circuit for a pixel unit includes a driving transistor T1, a switching transistor T2, and a capacitor C1. The data line Dm is electrically connected to an input terminal of the switching transistor T2, the scan line Sn is electrically connected to a control terminal of the switching transistor T2, and an output terminal of the switching transistor is electrically connected to the control terminal of the driving transistor T1. The first power source VDD is electrically connected to an input terminal of the driving transistor, and the light emitting element OLED is electrically connected between an output terminal of the driving transistor T1 and the second power source VSS. The current flowing through the driving transistor T1 can be determined by:

$$I = \mu(V_{gs} - V_{th})^2,$$

where $V_{th}$ is a threshold voltage of the driving transistor T1, $V_{gs}$ is a voltage difference across the capacitor C1, and $\mu$ is a mobility of the driving transistor T1.

Due to the limitations of the manufacturing process, the threshold voltages and mobilities of different driving transistors can be different, resulting in current difference and luminance difference of the OLED display device. In addition, the threshold voltage and mobility of the driving transistor during the operation process of the OLED can also have drift and variation, resulting in differences in display luminance between different portions.

In addition, due to different operation conditions or aging after long-term operation, the threshold voltage and/or luminance of different portions of the light-emitting elements can also vary, affecting the visual experience of the user.

Accordingly, various solutions have been made to compensate for the threshold voltage and/or mobility of the driving transistor, and/or the electrical/optical performance of the illuminating element by detecting electrical or optical compensation parameters.

As is well known to those skilled in the art, the compensation methods can be divided into internal compensation and external compensation. Internal compensation refers to a method for compensating through a sub-circuit constructed by a thin film transistor inside a pixel. External compensation refers to a method for detecting electrical or optical compensation parameters through a detection circuit or device and then performing compensation.

Figure 1C:
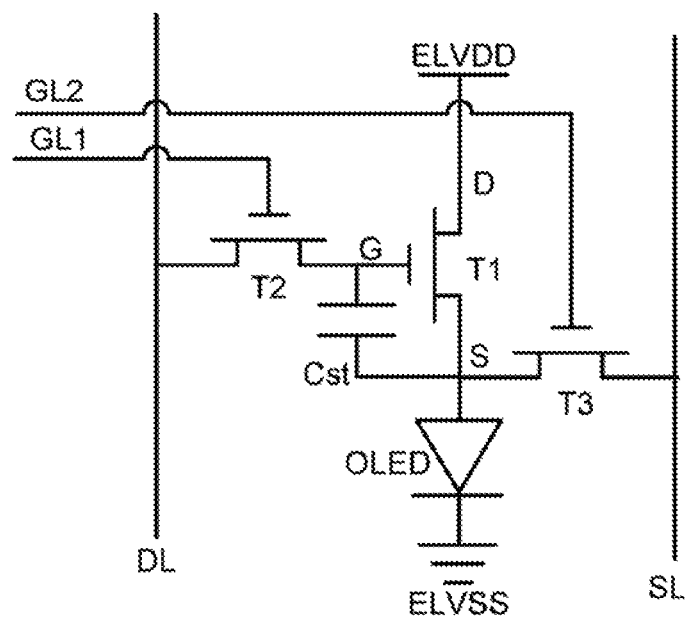
FIG. 1C illustrates, as an example, a driving circuit having a detection module.

FIG. 1C illustrates, as an example, a driving circuit having a detection module.

As shown in FIG. 1C, the driving circuit is substantially the same as the circuit shown in FIG. 1B, except that a detection transistor T3 is additionally provided. The detection transistor T3 is configured to control conduction and non-conduction between the sensing line SL and the S terminal of the driving transistor T1. The detection transistor T3 has a first terminal, a second terminal, and a control terminal electrically coupled to the S terminal of the first node driving transistor T1, the sensing line SL, and the control line GL2, respectively, such that the detection transistor T3 is turned on and off under control of the control signal from the control line GL2 to detect a compensation parameter, such as a threshold voltage and/or a mobility of the driving transistor. These are well known to those skilled in the art and will not be discussed in detail herein.

In addition to electrical compensation parameters, such as threshold voltage and/or mobility of the driving transistor, it is sometimes desirable to detect an optical compensation parameter, such as a luminance lookup table and a luminance fit parameter. The optical compensation parameter can include a luminance lookup table, and the luminance lookup table reflects a correspondence between an ideal luminance and a converted luminance. Optical compensation parameters include, but are not limited to, a luminance lookup table and a fitting parameter.

As an example, after the compensation parameters are obtained, the compensation display can be performed as follows.

When it is required to display first display data, a first converted luminance corresponding to the first display data is acquired from the luminance lookup table. Then, according to the first converted luminance and a luminance fitting parameter, second display data is obtained as:

$$L2 = k1 * L1 + k2,$$

where L2 denotes the second display data, L1 denotes the first converted luminance, and k1 and k2 denote luminance fitting parameters.

Then, according to the electrical compensation parameter and the second display data, third display data is obtained as:

$$L3 = \mu * L2 + V_{th},$$

where L3 denotes third display data, $V_{th}$ denotes the threshold voltage of the driving transistor, and $\mu$ denotes the mobility of the driving transistor.

In addition, different usage environments can also affect the visual experience of the user. Therefore, it is sometimes necessary to detect the environmental compensation parameter for compensating the display, for example, detecting parameters about ambient light, a viewing distance of the user, a current luminance of the organic light emitting display device, etc., for compensating the display, the details of which will not be described herein again.

Figure 2:
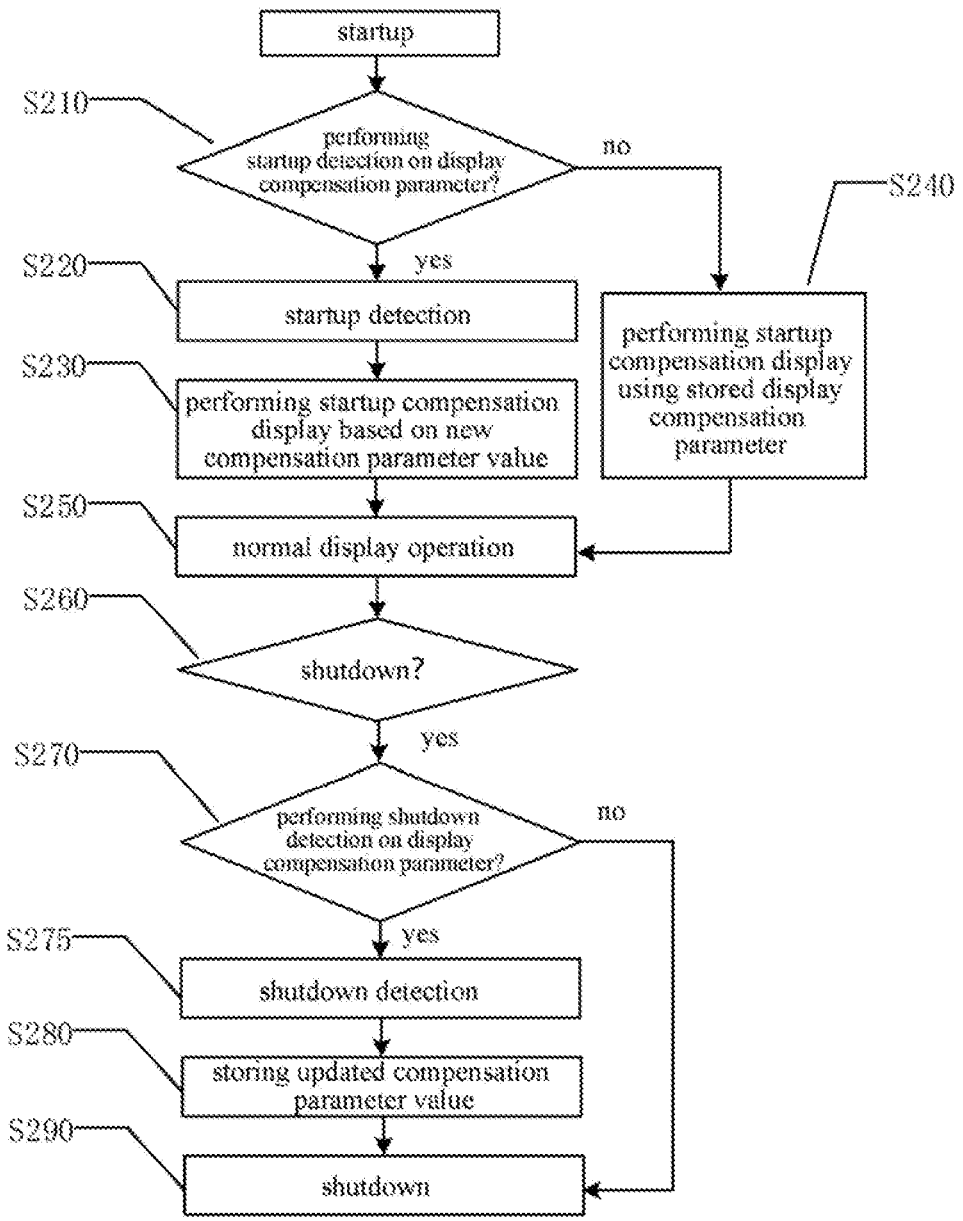
FIG. 2 illustrates a flowchart of a method for driving an organic light emitting display device according to an exemplary embodiment of the present disclosure.

FIG. 2 illustrates a flowchart of a method for driving an organic light emitting display device according to an exemplary embodiment of the present disclosure. In the method shown in FIG. 2, compensation detection is selectively performed during the startup and shutdown processes. The method shown in FIG. 2 will be described in detail below.

Referring to FIG. 2, at S210, during the startup operation stage of the organic light emitting display device, it is determined whether startup detection is required to be performed on the display compensation parameter of the organic light emitting display device. If the result of the determination is YES, the process goes to S220; otherwise, the process goes to S240.

As previously mentioned, in accordance with embodiments of the present disclosure, startup detection is not necessary in all cases. For example, when the usage frequency is relatively high, and each operation time period is not excessively long, the display compensation parameter will not notably change. In this case, it is not necessary to perform startup detection every time.

According to some embodiments, whether to perform startup detection can be determined according to at least one of a shutdown rest time duration, a temperature difference value between the time of startup and the time of shutdown, and a stage-cumulative display time duration.

For example, it can be determined whether the shutdown rest time duration is greater than a threshold (e.g., 12 hours). The shutdown rest time duration is the time elapsed since the last shutdown to the current startup. If the determination result is yes, the startup detection is performed; if the determination result is no, the startup detection is not performed or other determination can be made.

In another example, it can be determined whether the temperature difference value between the time of startup and the last time of shutdown is greater than a threshold (for example, 10 degrees Celsius). If the determination result is yes, the startup detection is performed; if the determination result is no, the startup detection is not performed or other determination can be made.

In another example, it can be determined whether the stage-cumulative display time duration is greater than a threshold (e.g., 120 hours). The stage-cumulative display time duration is a cumulative display operation time after the last time of startup detection or shutdown detection. If the determination result is yes, the startup detection is performed; if the determination result is no, the startup detection is not performed or other determination can be made. If the threshold is set to zero, it means that the shutdown detection was not performed at the last time of shutdown, and the startup detection is performed.

According to an exemplary embodiment, at least one of an ambient temperature, a panel temperature of the organic light emitting display device, and a circuit board temperature of the organic light emitting display device at the startup time can be acquired and then, a corresponding difference value between at least one of the detected ambient temperature, panel temperature, and circuit board temperature at the startup time and at least one of the ambient temperature, panel temperature, and circuit board temperature at the last time of shutdown is obtained for determining whether to perform startup detection on the display compensation parameter. For example, the ambient temperature at the startup time can be obtained, the temperature is compared with the ambient temperature obtained at the last time of shutdown, and it is determined whether the startup detection is performed according to the obtained difference value (for example, when the difference value is greater than a threshold, such as 5 degrees Celsius, the startup detection is performed). Similarly, the panel temperature and/or the circuit board temperature at the startup time can be obtained, the temperature is compared with the panel temperature/the circuit board temperature at the last time of shutdown, and it is determined whether the startup detection is performed according to the obtained difference value (for example, when the difference value is greater than a threshold, such as 10 degrees Celsius, the startup detection is performed).

At S220, when the startup detection is required to be performed on the display compensation parameter of the organic light emitting display device, the startup detection is performed on the display compensation parameter of the organic light emitting display device to obtain a new compensation parameter value.

The display compensation parameter can include at least one of an electrical compensation parameter and an optical compensation parameter, but the solution of the embodiment of the present disclosure is not limited thereto. Those skilled in the art can add or use other display compensation parameters as needed.

The electrical compensation parameter can include a threshold voltage and/or mobility of a driving transistor of each pixel unit, and/or a threshold voltage of a light emitting element of each pixel unit. The optical compensation parameter includes a luminance lookup table and a luminance fitting parameter for each pixel unit.

When startup detection is performed on the display compensation parameter of the organic light emitting display device, the display compensation parameter can further include an environmental compensation parameter. The environmental compensation parameter can include at least one of an ambient light parameter, a user viewing distance, and a current luminance of the organic light emitting display device.

These compensation parameters are well known to those skilled in the art and will not be discussed in detail herein to avoid departing from the essential aspects of the embodiments of the present disclosure. It is understandable that those skilled in the art can also use other display compensation parameters or those found in future, as needed, and the disclosure is not limited thereto.

At S230, startup compensation display is performed based on the new compensation parameter value. According to an embodiment, after the new compensation parameter value is obtained, the startup display data is compensated for display with the new compensation parameter value.

At S240, when no startup detection is required to be performed on the display compensation parameter of the organic light emitting display device, the stored display compensation parameter is used to perform the startup compensation display. For example, the startup display data is compensated for display based on the display compensation parameter read from the memory.

At S250, the normal display operation stage is performed. In the display operation stage, for example, real-time compensation detection can be performed for the organic light-emitting display device and the display data is compensated for display based on the display compensation parameter detected in real time.

At S260, it is determined whether or not the shutdown is performed. If the determination result is YES, the process goes to S270; otherwise, the process goes to S250.

At S270, during the shutdown operation stage of the organic light emitting display device, it is determined whether the shutdown detection is required to be performed for the organic light emitting display device. If the determination result is YES, the process goes to S275; otherwise, the process goes to S290.

As described above, according to an embodiment of the present disclosure, shutdown detection is not necessary in all cases. For example, when the usage time by the user is short, the display compensation parameter change will not be large, and it is not necessary to perform the shutdown detection every time.

According to some embodiments, whether to perform shutdown detection can be determined according to at least one of a stage-cumulative display time duration and a single-time display time duration.

For example, it can be determined whether the stage-cumulative display time duration is greater than a threshold (e.g., 120 hours). If the determination result is yes, the shutdown detection is performed; and if the determination result is no, the shutdown detection is not performed or other determination is made.

In another example, it can be determined whether the single-time display time duration is greater than a threshold (e.g., 2 hours). The single-time display time duration is the time elapsed after the startup operation to the current shutdown. If the determination result is yes, the shutdown detection is performed; if the determination result is no, the shutdown detection is not performed or other determination is made.

At S275, the shutdown detection is performed on the organic light emitting display device to obtain an updated compensation parameter value.

As previously mentioned, the display compensation parameter can include at least one of an electrical compensation parameter and an optical compensation parameter. The electrical compensation parameter can include a threshold voltage and/or mobility of a driving transistor of each pixel unit, and/or a threshold voltage of a light emitting element of each pixel unit. The optical compensation parameter includes a luminance lookup table and a luminance fitting parameter for each pixel unit. However, the solution of the embodiments of the present disclosure is not limited thereto. Those skilled in the art can add or use other display compensation parameters as needed.

At S280, the updated compensation parameter value is stored. According to an embodiment, after the updated compensation parameter is obtained by the shutdown detection, the updated compensation parameter value is stored in the memory for use in the next startup operation.

According to some embodiments, the organic light emitting display device is allowed to rest in a black screen for a period of time before the shutdown detection is performed on the organic light emitting display device to lower the temperature of the display panel.

According to some embodiments, the stage-cumulative display time duration is cleared to zero after the shutdown detection.

According to some embodiments, at least one of an ambient temperature, a panel temperature, and a circuit board temperature at shutdown time can also be acquired and stored during the shutdown operation stage for use at the next startup.

At S290, a normal shutdown operation is performed.

Figure 3:
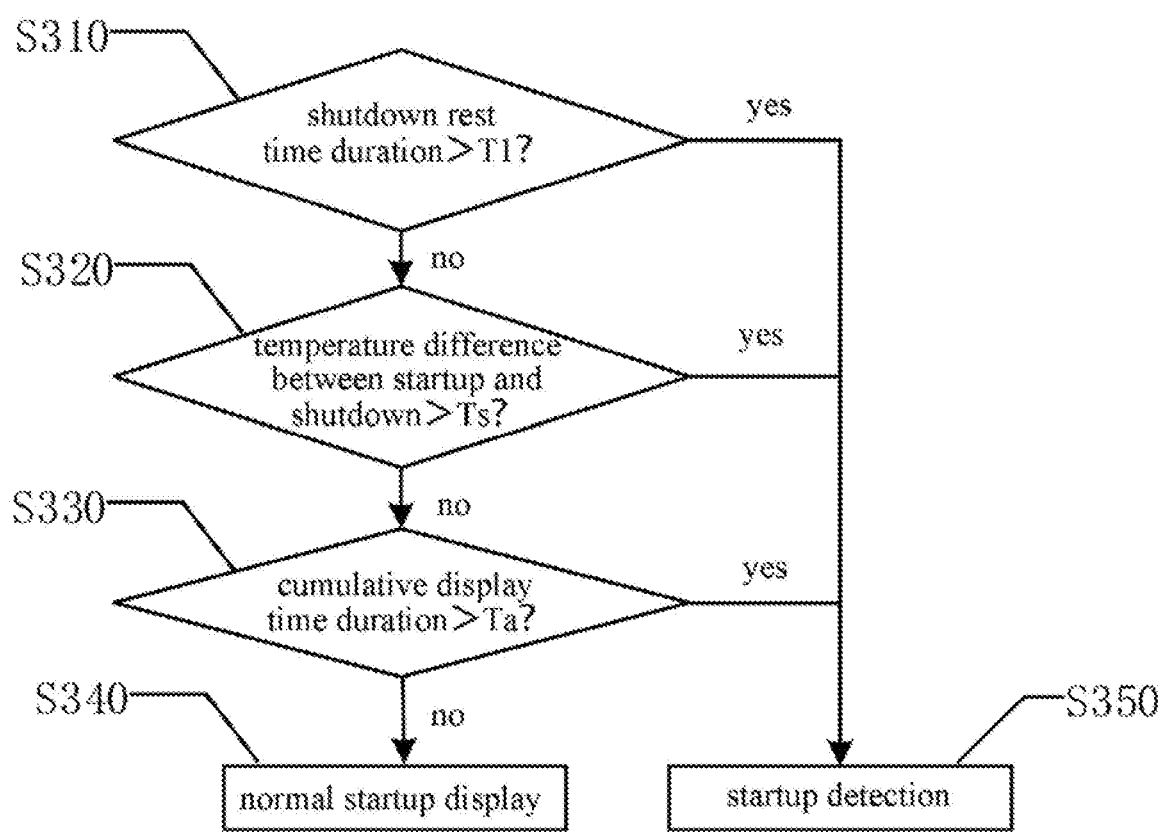
FIG. 3 illustrates a flowchart of startup detection of an organic light emitting display device according to an exemplary embodiment of the present disclosure.

FIG. 3 illustrates a flowchart of startup detection of an organic light emitting display device according to an exemplary embodiment of the present disclosure. It is to be understood that this is only one example for explaining the technical idea of the present disclosure, and the technical solution according to the embodiment of the present disclosure is not limited thereto.

As shown in FIG. 3, at S310, it is determined whether the shutdown rest time duration is greater than the first threshold T1. If it is greater than T1, the process goes to S350 for startup detection; if it is less than T1, the process goes to S320 for the next level of determination.

At S320, the temperature data at the last time of shutdown which is stored in the memory is compared with the temperature data from the temperature sensor at the time of startup. If the temperature difference is greater than a set value Ts, the process goes to S350 for startup detection; if the temperature difference is less than the set value Ts, the process goes to S330 for the next-level determination.

At S330, it is determined whether or not the cumulative display time duration is greater than the threshold value Ta. If the cumulative display time duration is greater than Ta, the process goes to S350 for startup detection; if the cumulative display time duration is not greater than Ta, the process goes to S340 for normal startup and display, without performing startup detection on the display compensation parameter. When the threshold value Ta is set to 0, if the cumulative display time duration is greater than the threshold value Ta, meaning that the shutdown detection was not performed at the last time of shutdown then, the startup detection is required; if the cumulative display time duration is equal to the threshold value Ta, it means that the shutdown was performed at the last time of shutdown, and normal startup and display can be performed.

Figure 4:
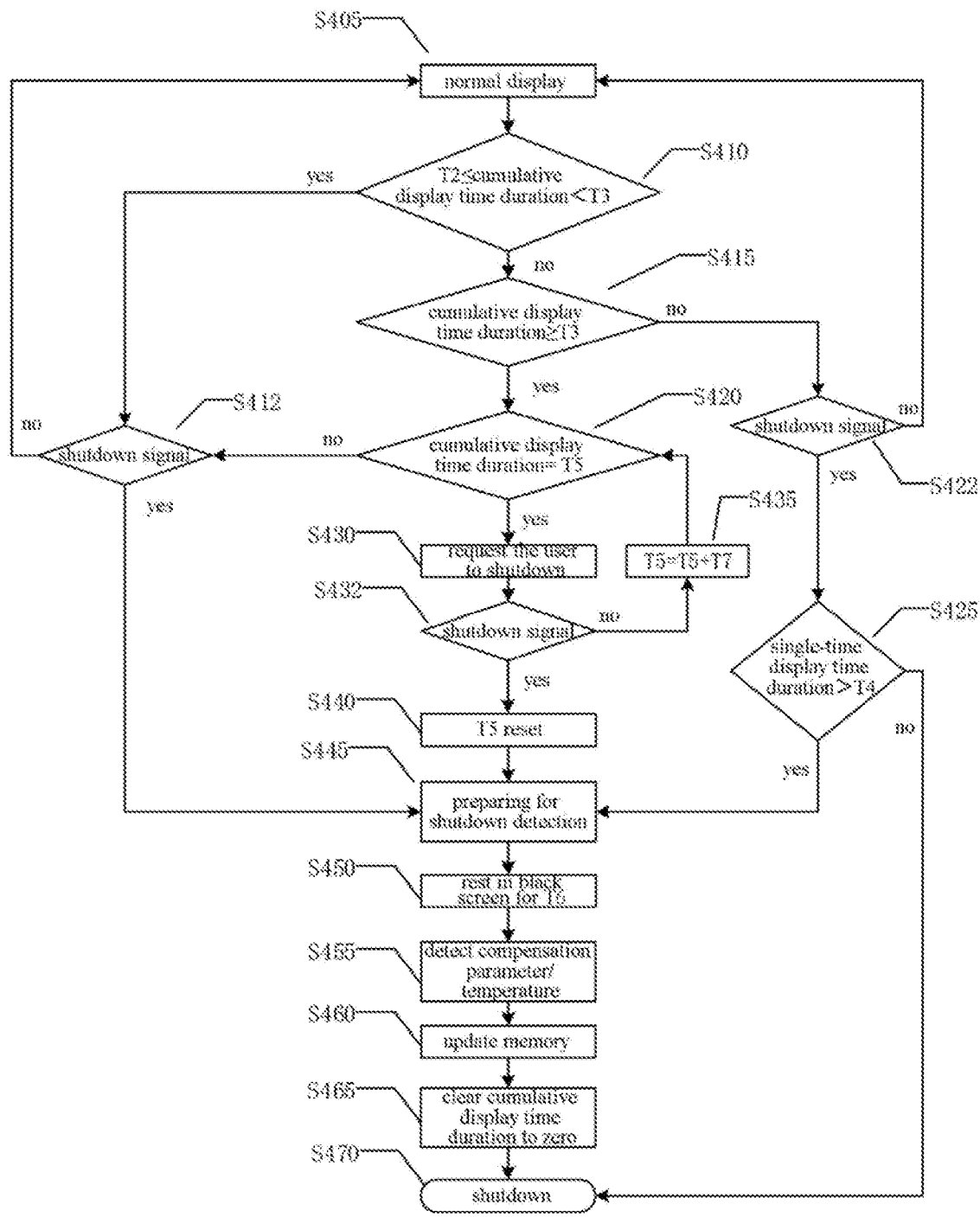
FIG. 4 illustrates a flowchart of shutdown detection of an organic light emitting display device according to an exemplary embodiment of the present disclosure.

FIG. 4 illustrates a flowchart of shutdown detection of an organic light emitting display device according to an exemplary embodiment of the present disclosure. It is to be understood that this is only one example for explaining the technical idea of the present disclosure, and the technical solution according to an embodiment of the present disclosure is not limited thereto.

As shown in FIG. 4, at S405, the display device normally displays and operates.

At S410, it is determined whether or not the cumulative display time duration (refer to the stage-cumulative display time duration) is equal to or larger than the predetermined value T2 and smaller than the predetermined value T3. If so, the process goes to S412. If not, the process goes to S415.

At S412, it is determined whether or not a shutdown signal is received. If the shutdown signal is not received, the process goes to S405 to continue the display. If a shutdown signal is received, the process goes to S445.

At S415, it is determined whether or not the cumulative display time duration is greater than or equal to T3. If so, the process goes to S420. If not, it indicates that the cumulative display time duration is less than T2, and the process goes to S422.

At S420, it is determined whether or not the cumulative display time duration is equal to the predetermined value T5. The predetermined value T5 can be equal to T3 or be a value greater than T3. If the determination result is YES, the process goes to S430; otherwise, the process goes to S412.

At S422, it is determined whether or not a shutdown signal is received. If no shutdown signal is received, the process goes to S405 to continue the display. If a shutdown signal is received, the process goes to S425.

At S425, it is determined whether or not the single-time display time duration is greater than the predetermined value T4. If so, the process goes to S445; otherwise, the process goes to S470.

At S430, since the cumulative display time duration is equal to T5, the client is requested to shut down.

At S432, it is determined whether or not the shutdown signal is received. If no shutdown signal is received, the process goes to S435; otherwise, the process goes to S440.

At S435, the predetermined value T5 is updated to increase by a predetermined value T7, and then the process goes to S420.

At S440, T5 is reset and restored to an initial predetermined value.

At S445, a shutdown detection command is sent, to get ready to enter shutdown detection.

At S450, before detecting the compensation parameter, the display device is left in a black screen for a period of time to lower the temperature of the panel, the circuit board, and the like.

At S455, compensation parameter detection is performed. In addition, temperature detection can also be performed to obtain temperature data.

At S460, the memory is updated.

At S465, the cumulative display time duration is cleared to zero.

At S470, a normal shutdown operation is performed.

Figure 5:
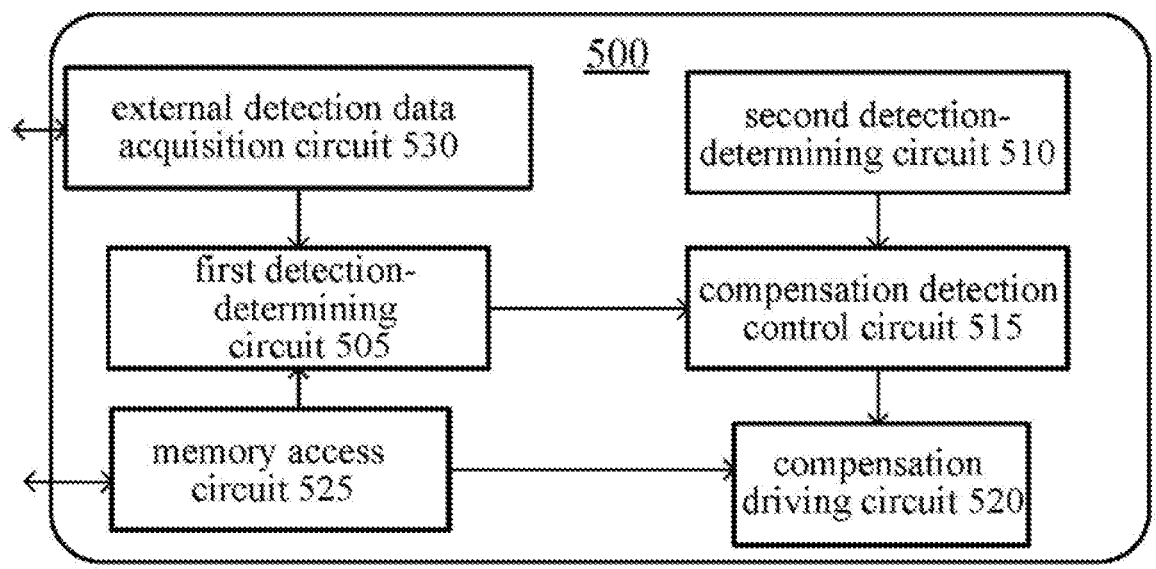
FIG. 5 illustrates a driving controller for an organic light emitting display device according to an exemplary embodiment of the present disclosure.

FIG. 5 illustrates a driving controller for an organic light emitting display device according to an exemplary embodiment of the present disclosure, which can implement the foregoing driving method.

The organic light emitting display device can be the device described with reference to FIG. 1A or other organic light emitting display device. The organic light emitting display device includes a plurality of pixel units, each of which includes a pixel driving circuit and a light emitting element coupled to the pixel driving circuit. The pixel driving circuit includes a driving transistor.

The organic light emitting display device further includes a compensation detection circuit for detecting a display compensation parameter, such as the detecting module or other detection circuit described with reference to FIG. 1C.

As shown in FIG. 5, the driving controller 500 according to an exemplary embodiment of the present disclosure includes a first detection-determining circuit 505, a second detection-determining circuit 510, a compensation detection control circuit 515, a compensation driving circuit 520, and a memory access circuit 525.

The first detection-determining circuit 505 is configured to determine whether startup detection is required to be performed on the display compensation parameter of the organic light emitting display device during the startup operation stage of the organic light emitting display device. For example, the first detection-determining circuit 505 can be configured to determine whether to perform startup detection according to at least one of a shutdown rest time duration, a temperature difference value between the time of startup and the time of shutdown, and a stage-cumulative display time duration.

As described above, the display compensation parameter can include at least one of an electrical compensation parameter and an optical compensation parameter, but the solution of the embodiment of the present disclosure is not limited thereto. Those skilled in the art can add or use other display compensation parameters as needed. The electrical compensation parameter can include a threshold voltage and/or mobility of a driving transistor of each pixel unit, and/or a threshold voltage of a light emitting element of each pixel unit. The optical compensation parameter includes a luminance lookup table and a luminance fitting parameter for each pixel unit. When startup detection is performed on the display compensation parameter of the organic light emitting display device, the display compensation parameter can further include an environmental compensation parameter. The environmental compensation parameter can include at least one of an ambient light parameter, a user viewing distance, and a current luminance of the organic light emitting display device. It is easy to understand that those skilled in the art can also use other display compensation parameters or those found in future, as needed, and the disclosure is not limited thereto.

According to some embodiments, the driving controller 500 can receive a user control signal CTRL that includes data such as a shutdown/startup time difference, a shutdown command, and the like. The first detection-determining circuit 505 can acquire the shutdown rest time duration according to the user control signal CTRL, and accordingly determine whether to perform the startup detection on the display compensation parameter.

According to some embodiments, the driving controller 500 can further include an external detection data acquisition circuit 530 configured to acquire external environment detection data. The external detection data acquisition circuit 530 can receive external sense data (ESD) from an external sensor, such as an ambient temperature, a panel temperature of the organic light-emitting display device, a circuit board temperature of the organic light-emitting display device, and the like.

The first detection-determining circuit 505 can compare the temperature data obtained by the external detection data acquisition circuit 530 at the time of startup with the temperature at the last time of shutdown stored in the memory by the memory access circuit 525 to obtain a temperature difference value and determine accordingly whether to perform startup detection on the display compensation parameter.

According to some embodiments, the first detection-determining circuit 505 can acquire a stage-cumulative display time duration stored in the memory by the memory access circuit 525, and determine whether to perform the startup detection on the display compensation parameter.

The second detection-determining circuit 510 is configured to determine whether shutdown detection is required to be performed on the organic light emitting display device during the shutdown operation stage of the organic light emitting display device. For example, the second detection-determining circuit 510 can be configured to determine whether to perform shutdown detection based on at least one of the stage-cumulative display time duration and the single-time display time duration.

The compensation detection control circuit 515 is configured to control the compensation detection circuit to perform startup detection or shutdown detection to obtain a new compensation parameter value according to the determination result of the first detection-determining circuit or the second detection-determining circuit.

The compensation detection control circuit 515 can receive ISD data (internal sense data, which refers to data sensed from inside the display panel/pixel according to an electrical/optical compensation program) from an internal sensor. For example, the compensation detection control circuit 515 can receive a compensation parameter such as a threshold voltage and/or mobility from the detection driving transistor by controlling the driving circuit having the detection module shown in FIG. 1C. The compensation detection control circuit 515 can also acquire an environmental compensation parameter and the like through an internal or external sensor, which is not limited in the present disclosure.

The compensation driving circuit 520 is configured to perform startup display compensation according to the existing display compensation parameter or the new compensation parameter value during the startup operation stage. For example, through the compensation formula mentioned earlier:

$$L3=\mu*L2+V_{th}.$$

However, the present disclosure is not limited to specific compensation methods and processes.

According to some embodiments, the compensation driving circuit 520 is further configured to perform real-time compensation detection on the organic light-emitting display device during the display operation stage, and perform display compensation on the display data based on the display compensation parameter detected in real time. This is understood and well known to those skilled in the art and will not be described again.

The memory access circuit 525 is configured to access an external memory. As previously mentioned, the external memory can display any data related to display compensation and other data, such as a display compensation parameter, temperature data, stage cumulative display time duration, and the like.

According to some embodiments, the driving controller 500 can be integrated into a timing controller of the display device as part of the timing controller. Although it is described above that the driving controller 500 is configured to perform some of the steps of the method for driving an organic light emitting display device according to the exemplary embodiment of the present disclosure, it is appreciated by those skilled in that some or all of the steps of the method for driving an organic light emitting display device according to the exemplary embodiment of the present disclosure can be performed by a processor. Correspondingly, there is provided an organic light emitting display device including a processor (e.g., at least one hardware processor), which is configured to perform the method for driving an organic light emitting display device according to the exemplary embodiment of the present disclosure. Further, as described below, the organic light emitting display device may further include a memory and a temperature sensor. The memory may store data related to display compensation, and the temperature sensor may acquire at least one of an ambient temperature, a panel temperature of the organic light emitting display device, and a circuit board temperature of the organic light emitting display device.

Figure 6:
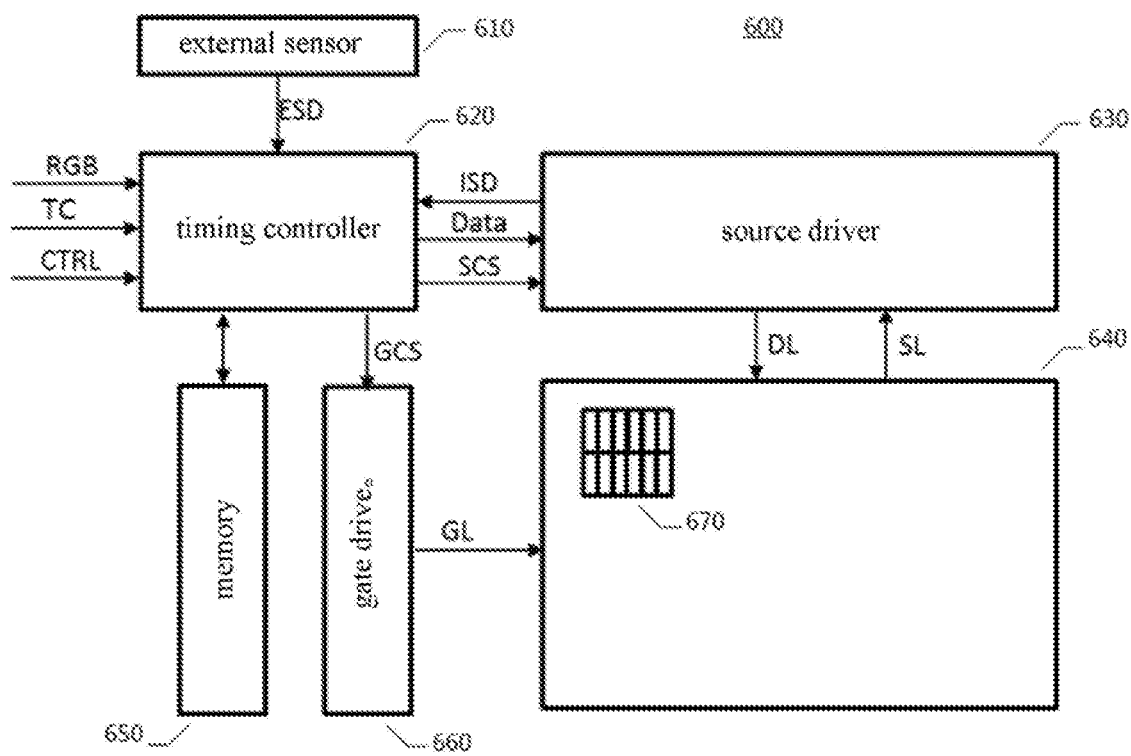
FIG. 6 illustrates an organic light emitting display device according to an exemplary embodiment of the present disclosure.

FIG. 6 illustrates an organic light emitting display device (OLED) according to another exemplary embodiment of the present disclosure, which can include a driving controller and a memory according to an embodiment of the present disclosure as described above. The driving controller can be integrated into the timing controller. The memory is configured to store data related to display compensation. It is to be understood that this is only one example for explaining the technical idea of the present disclosure, and the technical solution according to an embodiment of the present disclosure is not limited thereto. The details will be described below.

Referring to FIG. 6, the organic light emitting display device 600 includes an external sensor 610, a timing controller 620, a source driver 630, a display panel 640, a memory 650, and a gate driver 660.

The display panel 640 has a plurality of pixel units 670. Each of the pixel units 670 can include a pixel driving circuit and a light emitting element coupled to the pixel driving circuit. The pixel driving circuit includes a driving transistor.

The timing controller 620 reads data stored in the memory 650 and receives externally input RGB data, a timing control signal TC (Timing Control), and a user control signal CTRL. In addition, the timing controller 620 receives ISD (Internal Sense Data, which refers to data from an internal sensor, such as a compensation parameter detected inside the pixel according to a compensation program) data output by, for example, a source driver. The timing controller 620 also receives an ESD (External Sense Data) signal from the external sensor 610. The external sensor 610 can detect data such as an ambient temperature, a panel temperature, a PCB temperature, and the like, and can also sense data such as ambient light, a user viewing distance, and a current luminance of the panel. The external sensor 610 can include, for example, a temperature sensor for acquiring at least one of an ambient temperature, a panel temperature of the organic light emitting display device, and a circuit board temperature of the organic light emitting display device.

The memory 650 stores compensation parameters such as threshold voltages Vth and mobilities of different driving TFTs, threshold voltages Voled of different OLED devices, and/or optical compensation parameters of different OLED devices, and the like. The memory 650 also stores time parameters such as a single-time display time duration and a stage-cumulative display time duration of the display device, temperature data at a certain time point, and storage parameters by areas and by timings.

The source driver 630 receives data Data and a source control signal SCS, and generates a corresponding data voltage to be output to the display panel through the data line DL. The gate driver 660 receives a gate control signal GCS, and generates a corresponding gate signal to be output to the display panel through the gate line GL. Through the control of the source driver 630 and the gate driver 660, the source driver 630 senses the electrical/optical characteristics of the pixels through the sensing line SL and generates corresponding detection data to be output to the timing controller 620.

Using the acquired compensation parameters, the timing controller 620 generates a compensated data signal Data and a source control signal SCS (Source Control Signal) and outputs them to the source driver 630 during the startup operation stage, the normal display stage, and the shutdown operation stage of the OLED. In addition, the timing controller 620 generates a gate control signal GCS (Gate Control Signal) and outputs it to the gate driver 660. The user control signal CTRL includes data such as a shutdown/ startup time difference, a shutdown command, and the like.

For example, during the startup stage, the timing controller 620 receives a CTRL signal transmitted from an external source, an ESD signal transmitted by the external sensor 610, and reads the data in the memory 650. Then, it is determined whether or not to perform the startup detection. If so, the compensation parameter is detected, and the startup compensation display is performed based on the new compensation parameter value. If not, the startup compensation display is performed according to the compensation parameter in the memory 650.

For example, during normal display operation, the timing controller 620 performs compensation display on the display data based on the display compensation parameters detected in real time. For example, the timing controller 620 detects and compensates for threshold voltage/mobility or/and OLED threshold voltage/luminance compensation parameters and the like of all driving TFTs in real time. If the shutdown signal is not received, the real-time detection and compensation display can be performed all the time.

For example, during the shutdown operation stage, the timing controller 620 determines whether to perform shutdown detection based on the CTRL signal transmitted from an external source, the ESD signal transmitted by the external sensor, the ISD signal transmitted by the source driver, and the single-time operation time duration. If so, some or all of the compensation parameters are detected, the memory is updated and then shut down. If not, the process goes directly to the shutdown operation.

Figure 7:
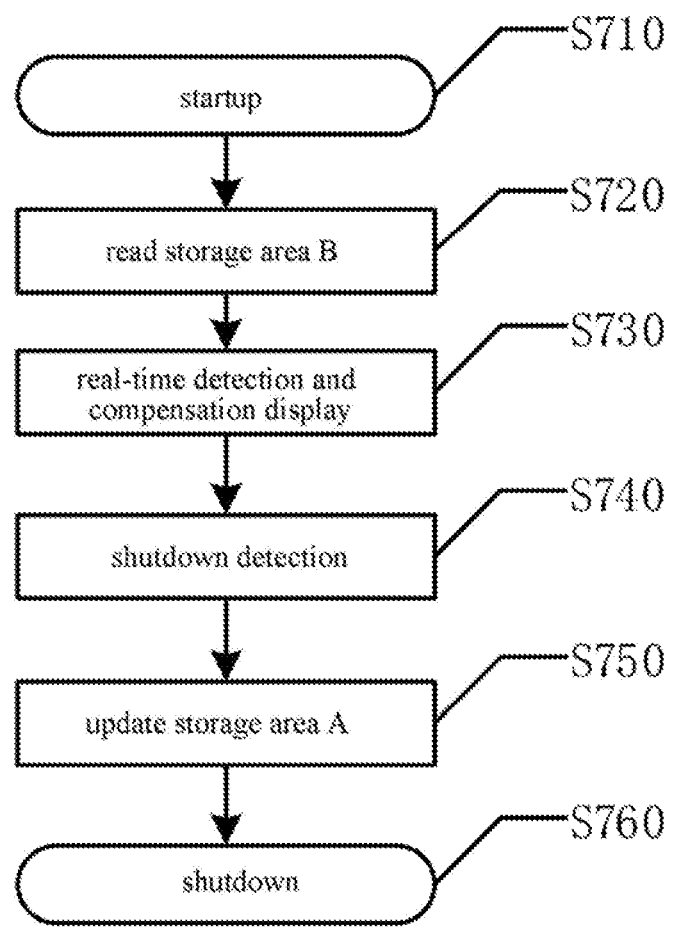
FIG. 7 illustrates a data update method according to an exemplary embodiment of the present disclosure.

FIG. 7 illustrates a data update method according to an exemplary embodiment of the present disclosure.

In order to avoid errors of stored data caused by dropping off of power or the like when updating the memory, the present embodiment employs two memory areas for data update.

Referring to FIG. 7, at S710, the device is started up.

At S720, a first storage area updated at the last time, such as storage area B, is read.

At S730, during normal display, detection is performed in real time and compensation display is performed.

At S740, shutdown detection is performed.

At S750, after the detection is completed, a second storage area such as storage area A is updated. In this way, when an unexpected power failure occurs during the update process, the data of the storage area B can be read the next time the device is started up, which will not affect the startup and the display.

At S760, the shutdown is completed.

From the above detailed description, those skilled in the art will readily appreciate that the systems and methods in accordance with embodiments of the present application have one or more of the following advantages.

According to some embodiments of the present disclosure, sensing determination is performed at the time of startup and the time of shutdown, and the compensation parameters are sensed when needed, and the startup and shutdown time durations are shortened, thereby improving the user experience.

According to some embodiments of the present disclosure, whether to perform the startup sensing is determined according to the shutdown rest time duration, the temperature difference value between the time of startup and the time of shutdown, and/or the stage-cumulative display time duration, etc., which can improve the accuracy of compensation.

According to some embodiments of the present disclosure, compensation detection is performed after the device is left in the black screen for a period of time at the time of shutdown, which can improve data reliability and usability.

It will be understood by those skilled in the art that the drawings are only schematic diagrams of the exemplary embodiments, and the modules or processes in the drawings are not necessarily essential for implementing the disclosure, and therefore are not intended to limit the scope of the disclosure.

It will be understood by those skilled in the art that the above various modules can be distributed in a device according to the description of the embodiments, or can be located in one or more devices different from the embodiment, in a corresponding variation. The modules of the above embodiments can be combined into one module, or can be further split into multiple sub-modules.

The exemplary embodiments of the present disclosure have been particularly shown and described above. It is to be understood that the present disclosure is not to be construed as being limited The foregoing description of the specific exemplary embodiments of the present disclosure has been presented with reference to the drawings. These exemplary embodiments are not intended to be exhaustive or to limit the disclosure to the precise forms disclosed. Understandably, many modifications and changes can be made by those skilled in the art. Therefore, the scope of the present disclosure is not intended to be limited to the foregoing embodiments, but is intended to be defined by the claims and their equivalents.

What is claimed is:

1. A method for driving an organic light emitting display device, comprising:
    providing the organic light emitting display device comprising a plurality of pixel units, each pixel unit comprising a pixel driving circuit and a light emitting element coupled to the pixel driving circuit, the pixel driving circuit comprising a driving transistor;
    during a startup operation stage of the organic light emitting display device, determining whether startup detection is required to be performed on a display compensation parameter of the organic light emitting display device by determining whether to perform the startup detection according to a stage-cumulative display time duration, wherein the stage-cumulative display time duration is a cumulative display operation time after the last time of startup detection or shutdown detection;
    when the startup detection is required to be performed on the display compensation parameter of the organic light emitting display device, performing startup operations of:
        performing the startup detection on the display compensation parameter of the organic light emitting display device to obtain a new compensation parameter value;
    and
        performing startup compensation display based on the new compensation parameter value;
    during a shutdown operation stage of the organic light emitting display device, determining whether shutdown detection is required to be performed for the organic light emitting display device by determining whether to perform the shutdown detection according to the stage-cumulative display time duration; and
    when the shutdown detection is required to be performed on the display compensation parameter of the organic light emitting display device, performing shutdown operations of: performing the shutdown detection on the organic light emitting display device to obtain an updated compensation parameter value; and storing the updated compensation parameter value.

2. The method according to claim 1, wherein the display compensation parameter comprises at least one of an electrical compensation parameter and an optical compensation parameter.

3. The method according to claim 2, wherein the electrical compensation parameter comprises at least one of a threshold voltage, mobility of the driving transistor of each pixel unit, and a threshold voltage of the light emitting element of each pixel unit.

4. The method according to claim 2, wherein the optical compensation parameter comprises a luminance lookup table and a luminance fitting parameter for each pixel unit.

5. The method according to claim 2, wherein, when the startup detection is performed on the display compensation parameter of the organic light emitting display device, the display compensation parameter further comprises an environmental compensation parameter, and the environmental compensation parameter comprises at least one of an ambient light parameter, a user viewing distance, and a current luminance of the organic light emitting display device.

6. The method according to claim 1, wherein determining whether the startup detection is required to be performed on the display compensation parameter of the organic light emitting display device further comprises:
    determining whether to perform the startup detection according to at least one of a shutdown rest time duration, and a temperature difference value between a time of startup and a last time of shutdown.

7. The method according to claim 6, wherein the shutdown operations further comprise: acquiring and storing at least one of an ambient temperature, a panel temperature, and a circuit board temperature at a time of shutdown.

8. The method according to claim 7, wherein the startup operations further comprise:
    acquiring at least one of the ambient temperature, the panel temperature of the organic light emitting display device, and the circuit board temperature of the organic light emitting display device at the time of startup; and
    acquiring a corresponding difference value between at least one of the ambient temperature, the panel temperature, and the circuit board temperature detected at the time of startup and at least one of the ambient temperature, the panel temperature, and the circuit board temperature at the last time of shutdown.

9. The method according to claim 1, wherein determining whether the shutdown detection is required to be performed for the organic light emitting display device further comprises:
    determining whether to perform the shutdown detection according to a single-time display time duration.

10. The method according to claim 1, wherein the shutdown operations further comprise:
    causing the organic light emitting display device to rest in a black screen for a period of time before the shutdown detection is performed on the organic light emitting display device.

11. The method according to claim 1, further comprising:
    during a display operation stage, performing real-time compensation detection on the organic light emitting display device, and performing compensation display on display data based on a display compensation parameter detected in real time.

12. The method according to claim 1, further comprising:
    when the startup detection is not required to be performed on the display compensation parameter of the organic light emitting display device, using the display compensation parameter as stored to perform startup compensation display.

13. An organic light emitting display device, comprising:
    a plurality of pixel units, each pixel unit comprising a pixel driving circuit and a light emitting element coupled to the pixel driving circuit, the pixel driving circuit comprising a driving transistor, the organic light emitting display device further comprising a compensation detection circuit; and a processor and memory for storing data related to display compensation, wherein the processor is configured to:
during a startup operation stage of the organic light emitting display device, determine whether startup detection is required to be performed on a display compensation parameter of the organic light emitting display device by determining whether to perform the startup detection according to a stage-cumulative display time duration, wherein the stage-cumulative display time duration is a cumulative display operation time after the last time of startup detection or shutdown detection;
when the startup detection is required to be performed on the display compensation parameter of the organic light emitting display device, perform startup operations of:
performing the startup detection on the display compensation parameter of the organic light emitting display device to obtain a new compensation parameter value; and
performing startup compensation display based on the new compensation parameter value;
during a shutdown operation stage of the organic light emitting display device, determine whether shutdown detection is required to be performed for the organic light emitting display device by determining whether to perform the shutdown detection according to the stage-cumulative display time duration; and
when the shutdown detection is required to be performed on the display compensation parameter of the organic light emitting display device, perform shutdown operations of:
performing the shutdown detection on the organic light emitting display device to obtain an updated compensation parameter value; and
storing the updated compensation parameter value.

14. The organic light emitting display device according to claim 13, wherein determining whether the startup detection is required to be performed on the display compensation parameter of the organic light emitting display device further comprises:
determining whether to perform the startup detection according to at least one of a shutdown rest time duration, and a temperature difference value between a time of startup and a last time of shutdown.

15. The organic light emitting display device according to claim 14, wherein the shutdown operations further comprise:
acquiring and storing at least one of an ambient temperature, a panel temperature, and a circuit board temperature at a time of shutdown.

16. The organic light emitting display device according to claim 15, wherein the startup operations further comprise:
acquiring at least one of the ambient temperature, the panel temperature of the organic light emitting display device, and the circuit board temperature of the organic light emitting display device at the time of startup; and
acquiring a corresponding difference value between at least one of the ambient temperature, the panel temperature, and the circuit board temperature detected at the time of startup and at least one of the ambient temperature, the panel temperature, and the circuit board temperature at the last time of shutdown.

17. The organic light emitting display device according to claim 13, wherein determining whether the shutdown detection is required to be performed for the organic light emitting display device further comprises:
determining whether to perform the shutdown detection according to a single-time display time duration.

18. The organic light emitting display device according to claim 13, wherein the shutdown operations further comprise:
causing the organic light emitting display device to rest in a black screen for a period of time before the shutdown detection is performed on the organic light emitting display device.

19. The organic light emitting display device according to claim 13, wherein the processor is further configured to:
during a display operation stage, perform real-time compensation detection on the organic light emitting display device; and
perform compensation display on display data based on a display compensation parameter detected in real time.

20. The organic light emitting display device according to claim 13, further comprising:
a temperature sensor configured to acquire at least one of: an ambient temperature, a panel temperature of the organic light emitting display device, and a circuit board temperature of the organic light emitting display device.

* * * * *